United States Patent [19]

Doss

[11] Patent Number: 4,659,984

[45] Date of Patent: Apr. 21, 1987

[54] PASSIVE INTEGRATING ELECTROMAGNETIC FIELD DOSIMETER

[76] Inventor: James D. Doss, 905 Tewa Loop, Los Alamos, N. Mex. 87544

[21] Appl. No.: 679,207

[22] Filed: Dec. 6, 1984

[51] Int. Cl.$^4$ ............................................. G01R 21/04
[52] U.S. Cl. ..................................... 324/95; 343/703
[58] Field of Search ..................... 343/703; 324/95, 96

[56] References Cited

U.S. PATENT DOCUMENTS

| | | | |
|---|---|---|---|
| 3,147,439 | 9/1964 | Eakin | 343/703 |
| 3,198,945 | 7/1965 | Dewes et al. | 250/369 |
| 3,360,726 | 12/1967 | Peters | 324/119 |
| 3,405,274 | 10/1968 | Lakin | 250/83.6 |
| 3,432,814 | 3/1969 | Bissett | 340/173 |
| 3,691,459 | 9/1972 | Anderson | 343/703 |
| 3,783,448 | 1/1974 | Brodwin | 343/703 |
| 3,931,573 | 1/1976 | Hopfer | 343/703 |
| 4,044,303 | 8/1977 | Reindel | 343/703 |
| 4,207,518 | 6/1980 | Hopfer | 324/95 |
| 4,301,406 | 11/1981 | Shriner | 324/95 |

OTHER PUBLICATIONS

Doss; Passive Dosimeters for RF and Microwave Fields; Rev. Sci. Instrum., 55(3), Mar. 1984, (pp. 424–426).

*Primary Examiner*—Eli Lieberman
*Attorney, Agent, or Firm*—Samuel M. Freund

[57] ABSTRACT

A passive, integrating electromagnetic radiation power dosimeter. A radiofrequency or microwave antenna is combined with a diode detector/rectifier, a squaring circuit, and a electrochemical storage cell to provide an apparatus for determining the average energy of electromagnetic radiation incident on a surface. After a particular period of irradiation, the dosimeter can be interrogated electrically or visually, depending on the type of electrochemical cell employed, to yield the desired information. The apparatus has a substantially linear response to the electromagnetic power density over a wide range of electromagnetic field, and all of the energy required to record the incident energy is supplied by the electromagnetic field.

21 Claims, 5 Drawing Figures

PASSIVE INTEGRATING ELECTROMAGNETIC FIELD DOSIMETER

BACKGROUND OF THE INVENTION

The present invention relates generally to apparatus for quantitatively measuring the power of electromagnetic radiation, and more specifically to the passive, quantitative measurement of the time-integrated power of electromagnetic radiation incident on a surface.

Exposure of humans to high-level electromagnetic fields can lead to an increase in temperature in tissue which can cause damage. There is also increasing evidence that other, more subtle effects occur at field intensities much lower than those required to produce a measurable elevation in tissue temperature. Standards for maximum human exposure to electromagnetic fields at various frequencies have been proposed, and consequently there is a need for a dosimeter which can be worn by individuals who are likely to be exposed to electromagnetic radiation.

Since it is the specific absorption rate over a known period of time that appears to be related to thermal and non-thermal biological effects, it is important that an integrating dosimeter be able to respond in a linear manner to the power density of the electromagnetic radiation incident on a surface over a wide range of field intensities. Identical information cannot be obtained by integration of the varying electric or magnetic fields, since the power density is proportional to the square of either the electric or magnetic field and the time-history of the electric or magnetic field would then be necessary to obtain a measure of the power density. Integrating personnel monitors known to the inventor are responsive to either the electric or magnetic components of the electromagnetic field except for a narrow range of field intensities, and are therefore not time-integrated power dosimeters.

"Electrolytic Devices," issued to T. B. Bissett on Mar. 11, 1969, the inventor describes the use of an electrochemical cell and a dipole antenna as part of a radar warning device. The system is a passive one in that no external power source is required to record the irradiation information in the electrochemical cell. However, there is no teaching therein as to how to passively measure the integrated radiation power.

Similarly, in "Radio Frequency Dosimeter," U.S. Pat. No. 3,147,439 issued to Kenneth K. Eakin on Sept. 1, 1964, the inventor teaches the use of pulse counting or charge accumulating devices to record the rectified current from an antenna receiving the incident radiation in pulsed or continuous-wave form to determine the radiation dose. Again, there is no teaching directed to the more relevant determination of the integrated power density.

The teachings of "Passive Dosimeters for Rf and Microwave Fields," by James D. Doss, Rev. Sci. Instrum. 55, 424 (1984), which contains information relevant to the subject invention, is hereby incorporated by reference herein.

Accordingly, it is an object of the present invention to provide an apparatus for passively measuring the time-integrated power of electromagnetic radiation incident on a surface.

Another object of my invention is to provide a personal dosimeter for passively determining the time-integrated power of electromagnetic radiation impinging on the body of an individual.

Yet another object of the present invention is to provide a personal dosimeter for passively determining the integrated power of electromagnetic radiation above a predetermined level impinging on the body of an individual.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects and in accordance with the purpose of the present invention, as embodied and broadly described herein, the apparatus hereof includes an antenna for receiving and interacting with the incident electromagnetic radiation, means for rectifying the alternating voltage generated by the antenna as a result of the interaction with the electromagnetic field, means for generating a current which is proportional to the square of the dc voltage produced in the rectification process, an electrochemical storage cell through which the current is passed, thereby producing a response, and means for measuring the response so produced, the magnitude of the response being substantially proportional to the time-integrated power of the incident electromagnetic radiation. It is preferred that means are provided for tuning the response of the antenna to match the wavelength of the electromagnetic radiation. Preferably also the electrochemical storage cell can be interrogated by measuring the equivalent charge required to restore it to its initial unplated condition in the case of an electrically interrogated cell, or, when a different type of electrochemical cell is employed, by visually inspecting it. In both situations, the condition of the electrochemical storage cell would be relatable to the time-integrated power of incident electromagnetic radiation. It is also preferred that the means for generating a current which is proportional to the square of the dc voltage produced in the rectification process include an array of resistors and diodes having an overall resistance which is substantially inversely proportional to the dc voltage, the array being placed in series electrical contact with the electrochemical storage cell, thereby permitting the current to pass through the cell. All of the energy required for the generation of the current derives from the electromagnetic field.

Benefits and advantages of the present invention include the fact that it is the desired integrated power of the incident electromagnetic field which is being measured, the absence of a requirement of an external power source to enable the measurement, all of the energy being supplied by the electromagnetic field, and the compactness of the apparatus, which permits the device to be worn in the form of a dosimeter badge by the individual experiencing the electromagnetic radiation.

BRIEF DESCRIPTION OF THE DRAWINGS

The accompanying drawings, which are incorporated in and form a part of the specification, illustrate three embodiments of the present invention, and together with the description, serve to explain the principles of the invention. In the drawings.

DETAILED DESCRIPTION OF THE INVENTION

Figure 1:
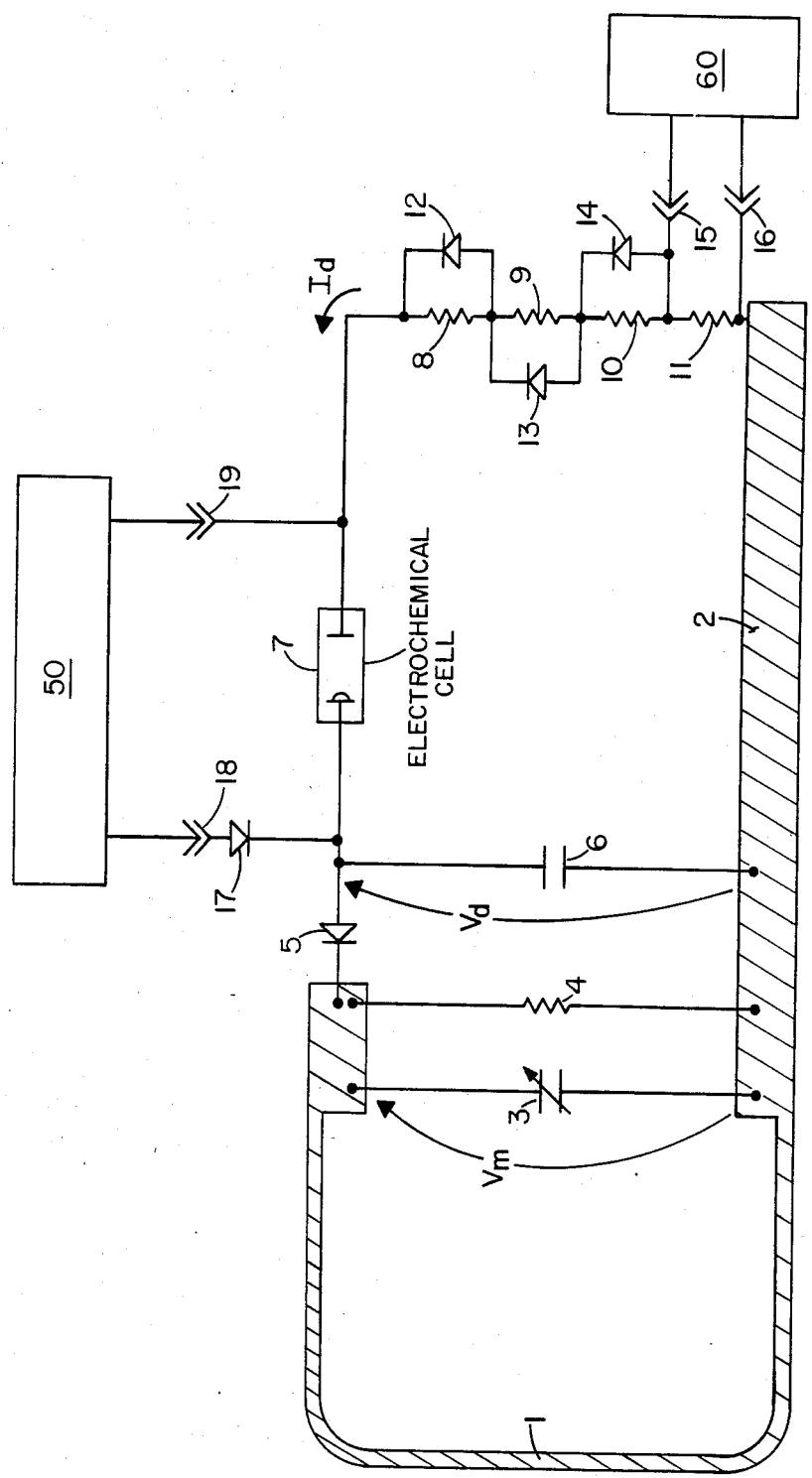
FIG. 1 shows a schematic representation of one embodiment of the apparatus of the present invention, wherein an electrically interrogatable electrochemical storage cell and the series form of the current squaring network are employed.

Briefly, the passive dosimeter of the present invention includes a tuned antenna, the alternating voltages generated thereby in response to radiofrequency or microwave radiation being detected and rectified by a diode, the voltage resulting therefrom being applied to a squaring network which provides a current proportional to the square of this voltage, which current is in turn drives an electrochemical storage cell for storage until measurement thereof at a later time. In this manner, the time-integrated power density impinging on the dosimeter, which is equivalent to the total absorbed energy, can be determined.

Reference will now be made to the present preferred embodiments of the invention, examples of which are illustrated in the accompanying drawings. In the drawings, corresponding parts are referenced throughout by similar numerals.

Turning to FIG. 1, which shows a schematic representation of one embodiment of the dosimeter of my invention, a radiofrequency or microwave antenna 1 receives the electromagnetic radiation. An adjustable capacitor 3 permits the tuning of the antenna loop when inserted between one end of loop 1 and a common reference bus 2, while load resistor 4 is used to alter the quality factor and the sensitivity of the circuit. If the quality factor is adjusted to be low, the radiation detector circuit of the present invention can operate in a relatively broad-banded manner. AC voltages, $V_m$, arising from the interaction of the detector loop with the incident radiofrequency radiation are rectified by diode 5 and filtered by capacitor 6. The resulting direct voltage, $V_d$ is impressed onto an electrically-interrogated electrochemical storage cell 7 which is wired in series with a series-configuration squaring network which includes resistors 8, 9, and 10, and diodes 12, 13, and 14. The current generated by the response of the storage cell and squaring circuit to $V_d$ is proportional to the square of $V_m$. The antenna loop 1 may be tuned to resonance while monitoring the voltage across resistor 11 using terminals 15 and 16 by employing voltage measuring device 60. The electrochemical storage cell 7 may be interrogated and reset by using terminals 18 and 19 to pass a direct current through it having opposite polarity to the current it received from the detector circuit. The reset current is provided by the charge measuring device 50, and the reseting process is terminated when the electrochemical cell is restored to its unplated state. Blocking diode 17 aids in the prevention of interrogation current being applied in the wrong direction. According to my invention, the series squaring network operates as follows. At low voltage levels, the impedance of the circuit is the sum of that for resistors 8, 9, 10, and 11. As the voltage increases, the diode connected across the largest resistor having the largest resistance value begins to conduct, effectively placing a relatively low resistance in parallel with that resistor. This decreases the impedance of the resistor/diode network. As the voltage increases further, the diodes connected in parallel with the progressively smaller resistance value resistors will begin to conduct, causing further decreases in the network impedance. By careful examination of the squaring network elements, it can be seen that the network impedance may be adjusted to be stepwise inversely proportional to the applied voltage, yielding thereby a current which is approximately proportional to the square of this voltage. In the choice of resistors, it is necessary that the lowest resistor impedance be much higher than the resistance of the electrochemical cell. In a preferred embodiment of my invention, Schottky barrier devices having turn-on voltages of about 250 mV and an on-resistance of approximately 100 Ohms were used, with resistors having resistance values of 240,000, 150,000, and 100,000 Ohms, respectively, for resistors 8, 9, and 10, and with the sampling resistor 11 having a resistance of 130,000 Ohms. The current derived from the squaring network was found to be closely proportional to the square of the input voltage, $V_d$, over a range from 0 to 1300 mV. The addition of more diode/resistor segments would improve the square law approximation of the network.

Figure 2:
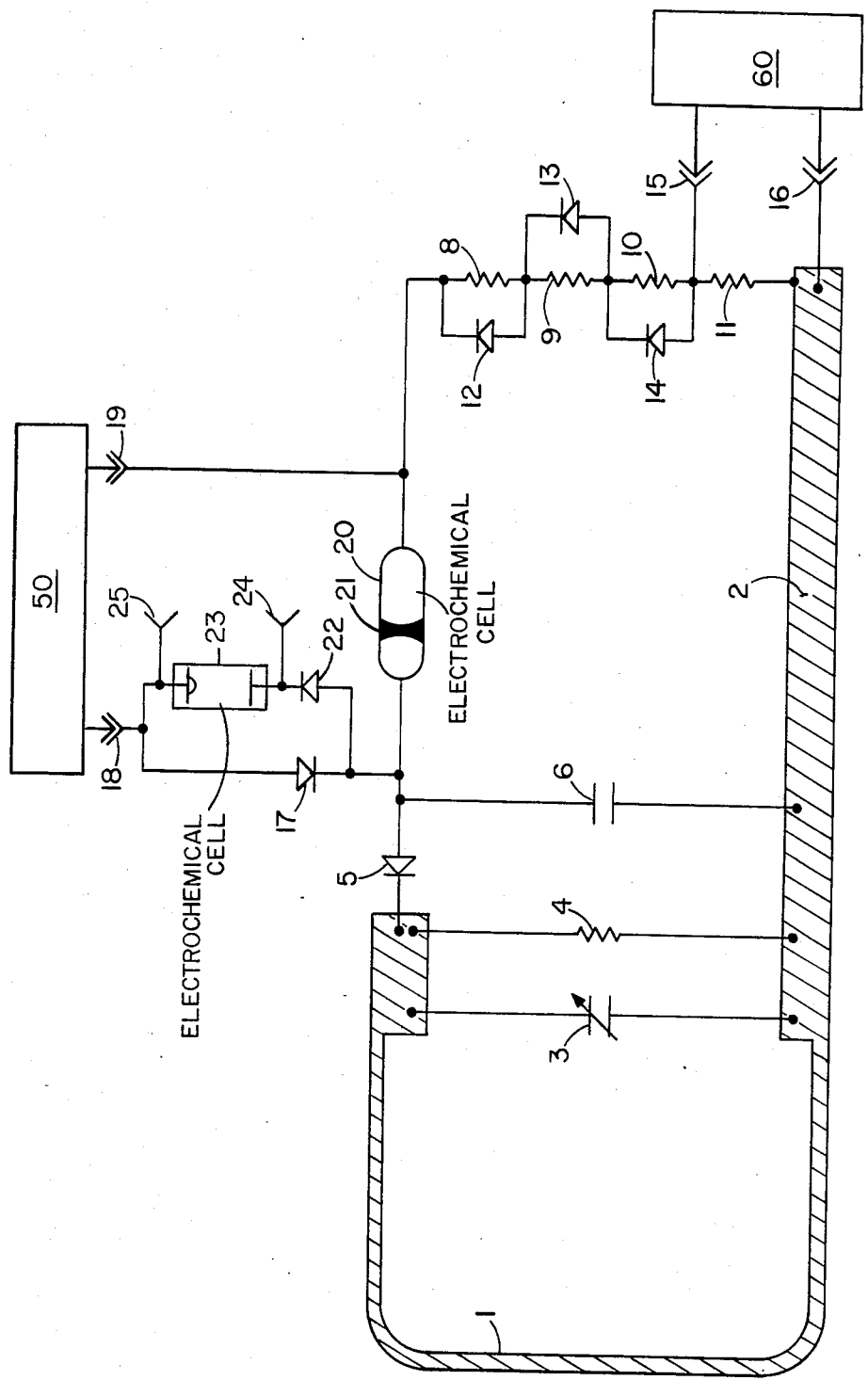
FIG. 2 shows a schematic representation of a second embodiment of the apparatus of my invention, wherein a visually interrogatable electrochemical storage cell, a tampering monitoring electrochemical storage cell, and the series form of the current squaring network are employed.

FIG. 2 shows a second embodiment of the passive dosimeter of the present invention. A visual-readout electrochemical storage cell 20 is substituted for the electronically-interrogated cell shown in FIG. 1. As current is applied to this cell, a visible bubble 21 in the electrolyte contained in the cell moves from one end of a glass tube to the other end. After readout the bubble may be reset to its "zero dose" level at one end of the glass tube using a reverse electric current supplied through terminals 18 and 19 by a current supply 50. That is, a current opposite in polarity to that which resulted from the exposure of the dosimeter to electromagnetic fields would be impressed on the cell, as was done for the embodiment of my invention described in FIG. 1. Also shown in FIG. 2 is a second electrochemical storage cell 23 in series with a diode 22, where these two elements are in parallel with blocking diode 17 for the purpose of monitoring current accidentally or improperly added to the principal electrochemical storage cell 20 through the terminals 18, 19 used for reseting cell 20. The monitoring would be done using terminals 24 and 25 using current supply 50. It would be apparent to someone with ordinary skill in the art after studying the subject invention that this monitoring addition could also be added to the embodiment shown in FIG. 1.

Figure 3:
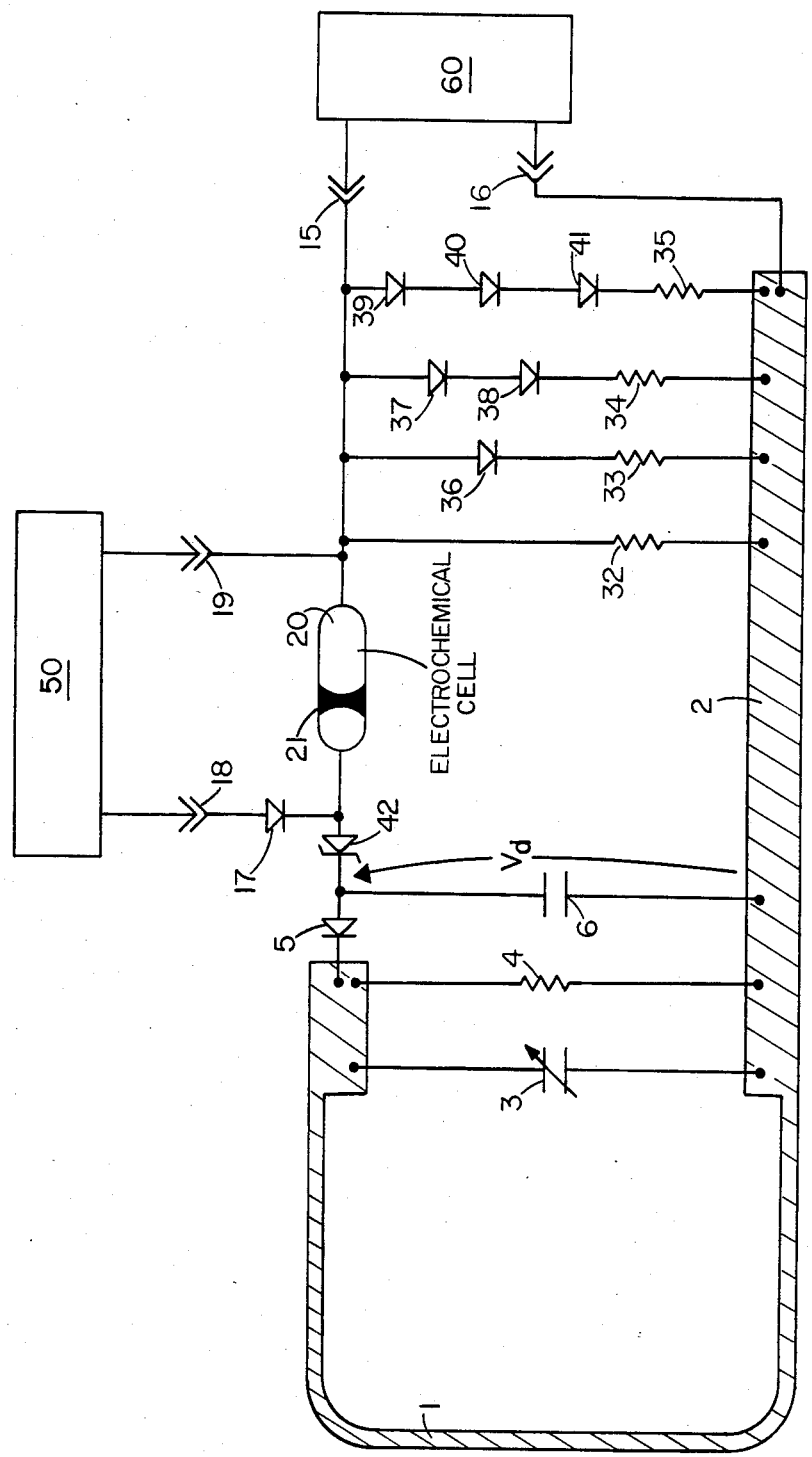
FIG. 3 shows a schematic representation of a third embodiment of the apparatus of the present invention, wherein a visually interrogatable electrochemical storage cell and the parallel form of the current squaring network are employed.

FIG. 3 shows an embodiment of my invention having a parallel arrangement of resistors in series with diodes for the squaring network, and Zener diode 42 to limit the sensitivity of the dosimeter to power densities which develop voltages, $V_d$, above that which causes the Zener diode to conduct. Resistors 32, 33, 34, and 35 are effectively connected successively in parallel by diode 36, then by diodes 37 and 38, and then by diodes 39, 40, and 41 as the applied voltage, $V_d$, increases. The monitoring terminals used for tuning the antenna circuit remain 15 and 16, but the voltage monitored is now the total voltage across the squaring network. In a similar manner to the series embodiment of the squaring network of the present invention, the parallel configuration can be made to respond in a manner such that the current passing through the electrochemical storage cell is approximately proportional to the square of $V_d$. Assuming that the diodes employed all have identical turn-on voltages and conducting-state resistances much lower than the resistance of resistor 32, it can be shown that for this network to approximate a squaring transform, each of the network resistors 33, 34, and 35 must have one-half of the resistance value of resistor 32 which is selected to have a resistance value greatly in excess of the resistance of the electrochemical cell. To increase the range of the squaring network, parallel legs, each having an additional identical diode to the leg preceding it, may be added. The parallel squaring network, although requiring more components than does the series type squaring network, is more straightforward to design. It should be noted that fewer diodes per leg might be used if diodes having different turn-on voltages were employed.

Figure 5:
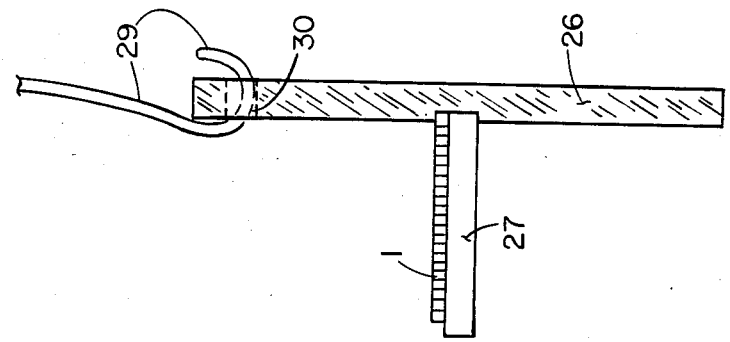
FIG. 5 is a side view of the badge mount shown in FIG. 4.
Figure 4:
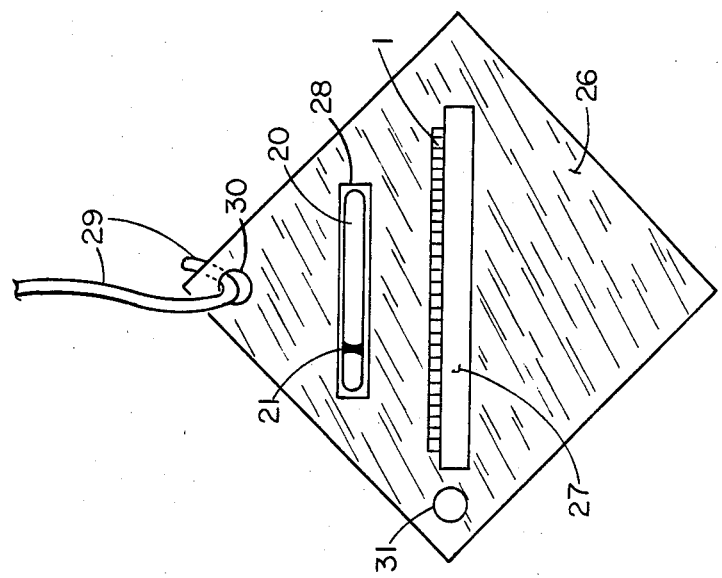
FIG. 4 is a front view of a badge mount generally useful in combination with any of the three embodiments of my invention shown in FIGS. 1-3, and briefly described hereinabove, when a personal radiofrequency or microwave dosimeter is required, showing two orthogonal support arrangements to improve the coupling of the dosimeter antenna to the incident microwave radiation according to the polararization of the electric field thereof.

FIGS. 4 and 5 show views of the dosimeter of the present invention being mounted on a badge for use by an individual. Antenna loop 1 of the dosimeter is mounted at right angles to the surface of the badge 26 on support 27. With the loop mounted in this manner, the user can suspend the badge using either of two orthogonally disposed holes 30,31 and hook 29 to orient the loop in a manner which maximizes the detected signal according to the polarization of the incident radiation. Clearly, a multiplicity of dosimeter badges could be used to simultaneously record radiation from a number of sources giving rise to multiple polarizations. Badge 26 also serves as a hollow electromagnetic radiation shielding enclosure which houses the balance of the dosimeter circuitry in order to prevent detection of unwanted electromagnetic field components. Slot 28, cut in the shielded enclosure, permits the viewing of a visually interrogated electrochemical storage cell 20, if such a cell is employed.

The foregoing description of three embodiments of the invention has been presented for purposes of illustration and description. It is not intended to be exhaustive or to limit the invention to the precise form disclosed, and obviously many modifications and variations are possible in light of the above teaching. For example, a variety of other antennas, squaring networks, detector arrangements and electrical storage cells might be used according to the teachings of my invention. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What I claim is:

1. An apparatus for passively quantitatively measuring the time-integrated power of electromagnetic radiation radiation incident on a surface, the apparatus comprising in combination:
  a. antenna means for receiving and interacting with the incident electromagnetic radiation and generating therefrom an alternating voltage, the alternating voltage having a substantially proportional relationship to the incident electromagnetic radiation;
  b. means for receiving the alternating voltage and for producing therefrom a direct voltage, the direct voltage having a substantially proportional relationship to the alternating voltage;
  c. passive series and parallel connected, linear, and non-linear resistance means for receiving the direct voltage and for generating therefrom a first direct current having magnitude which is substantially proportional to the square of the direct voltage;
  d. a first electrochemical storage cell for receiving the first direct current and for interacting therewith to produce a response, the magnitude of the response being substantially proportional to the time-integral of the first direct current; and
  e. means for measuring the magnitude of the response, whereby the magnitude of the response is substantially proportional to the time-integrated power of the incident electromagnetic radiation.

2. The apparatus as described in claim 1, wherein means are provided for tuning said antenna means to more efficiently receive the incident electromagnetic radiation.

3. The apparatus as described in claim 2, wherein said means for receiving said direct voltage and for generating therefrom a first direct current which is proportional to the square of the direct voltage includes an array of diodes and resistors, said array having an overall resistance which is substantially inversely proportional to the direct voltage, thereby passively producing the first direct current, and wherein said array is placed in series electrical contact with said first electrochemical storage cell, thereby permitting the first direct current to pass through said electrochemical storage cell and interact therewith.

4. The apparatus as described in claim 3, wherein the response of said first electrochemical storage cell includes the transfer of electric charge, the magnitude of the transfer of electric charge occurring in substantial proportion to the time-integral of the first direct current passing through said first electrochemical cell.

5. The apparatus as described in claim 4, wherein said means for measuring the magnitude of the response includes means for passing an interrogating electric current through said first electrochemical storage cell in a manner that the transfer of electric charge is substantially quantitatively reversed, and for determining the quantity of the interrogating electric current required to achieve the quantitative reverse transfer of electric charge, whereby the quantity of interrogating electric current is substantially proportional to the time-integrated power of the incident electromagnetic radiation, and whereby the substantially quantitative reversal of the transfer of electric charge resets said electrochemical storage cell in such a manner that said electrochemical storage cell can be repeatedly used to quantitatively measure the time-integrated power of electromagnetic radiation.

6. The apparatus as described in claim 5, wherein means are provided for blocking the current to said electrochemical storage cell if the power of the incident electromagnetic radiation is below a predetermined value.

7. The apparatus as described in claim 6, wherein said array includes one resistior electrically connected in series with at least one series electrically connected, parallel electrically connected diode and resistor combination.

8. The apparatus as described in claim 6, wherein said array includes one resistor electrically connected in parallel with at least one parallel electrically connected, series electrically connected diode and resistor combination.

9. The apparatus as described in claim 8, wherein means are provided to prevent the undetected introduction of external current to said apparatus in order to increase the measured time-integrated power of the incident electromagnetic radiation.

10. The apparatus as described in claim 9, wherein said means for preventing the undetected introduction of external current to said apparatus includes a diode placed in series electrical contact with said means for passing an interrogating electric current through said first electrochemical storage cell such that said interrogating electrical current flows solely in the direction required to substantially quantitatively achieve the reversal of said transfer of electric charge.

11. The apparatus as described in claim 10, wherein said means for preventing the undetected introduction of external current to said apparatus further includes a second electrochemical storage cell electrically connected in parallel with said diode, whereby reverse biasing said diode will cause a measurable response in said second electrochemical storage cell.

12. The apparatus as described in claim 11, wherein means are provided for permitting said apparatus to be worn as a badge, said badge means having two orthogonal support positions, whereby said antenna means can be oriented to generate the largest interaction between said antenna means and the electromagnetic radiation.

13. The apparatus as described in claim 3, wherein the response of said first electrochemical storage cell includes the linear motion of a bubble within said first electrochemical storage cell, the linear motion of the bubble occurring in a substantially linear manner with the time-integral of the direct current passing through said first electrochemical storage cell, and wherein said means for measuring the magnitude of the response includes the visual observability of the linear motion of the bubble, the linear motion of the bubble being substantially quantitatively observable, whereby the substantially quantitatively observed linear motion of the bubble is substantially proportional to the time-integrated power of the incident electromagnetic radiation.

14. The apparatus as described in claim 13, wherein means are provided for blocking the current to said electrochemical storage cell if the power of the incident electromagnetic radiation is below a predetermined value.

15. The apparatus as described in claim 14, wherin said array includes one resistor electrically connected in series with at least one series electrically connected, parallel electrically connected diode and resistor combination.

16. The apparatus as described in claim 14, wherein said array includes one resistor electrically connected in parallel with at least one parallel electrically connected, series electrically connected diode and resistor combination.

17. The apparatus as described in claim 16, wherein means are provided to prevent the undetected introduction of external current to said apparatus in order to increase the measured time-integrated power of the incident electromagnetic radiation.

18. The apparatus as described in claim 17, wherein means are provided for resetting said first electrochemical storage cell to a zero-time-integrated electromagnetic power position, said resetting means including means for passing a second direct electric current through said first electrochemical storage cell in a direction opposite to that of the first direct current, thereby reversing the effect of the first electric current on said first electrochemical storage cell.

19. The apparatus as described in claim 18, wherein said means for preventing the undetected introduction of external current to said apparatus includes a diode placed in series electrical contact with said means for passing the second direct electric current through said first electrochemical storage cell such that the second direct electrical current flows solely in the direction required to reset said first electrochemical storage cell.

20. The apparatus as described in claim 19, wherein said means for preventing the undetected introduction of external current to said apparatus further includes a second electrochemical storage cell electrically connected in parallel with said diode, whereby reverse biasing said diode will cause a measurable response in said second electrochemical storage cell.

21. The apparatus as described in claim 20, wherein means are provided for permitting said apparatus to be worn as a badge, said badge means having two orthogonal support positions, whereby said antenna means can be oriented to generate the largest interaction between said antenna means and the electromagnetic radiation.

* * * * *